(12) United States Patent
Kim et al.

(10) Patent No.: US 7,294,857 B2
(45) Date of Patent: Nov. 13, 2007

(54) POLYSILICON THIN FILM TRANSISTOR ARRAY PANEL AND MANUFACTURING METHOD THEREOF

(75) Inventors: Hyun-Jae Kim, Seongnam (KR);
Sook-Young Kang, Seoul (KR);
Dong-Byum Kim, Seoul (KR);
Su-Gyeong Lee, Seoul (KR);
Myung-Koo Kang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 58 days.

(21) Appl. No.: 11/048,726

(22) Filed: Feb. 3, 2005

(65) Prior Publication Data

US 2005/0151196 A1    Jul. 14, 2005

Related U.S. Application Data

(63) Continuation of application No. 10/752,510, filed on Jan. 8, 2004, now Pat. No. 6,906,349.

(30) Foreign Application Priority Data

Jan. 8, 2003    (KR)    .............. 10-2003-0000971
Feb. 10, 2003    (KR)    .............. 10-2003-0008153

(51) Int. Cl.
*H01L 29/04* (2006.01)

(52) U.S. Cl. ............ 257/72; 257/59; 257/E33.004; 257/E21.133; 438/166; 438/486

(58) Field of Classification Search ............. 438/166; 257/72

See application file for complete search history.

(56) References Cited

U.S. PATENT DOCUMENTS

| | | | |
|---|---|---|---|
| 6,635,925 B1 | 10/2003 | Taniguchi et al. | ........... 257/335 |
| 6,906,346 B2 * | 6/2005 | Nishitani et al. | ............ 257/70 |
| 2001/0028060 A1 * | 10/2001 | Yamazaki et al. | ............ 257/72 |
| 2003/0196589 A1 * | 10/2003 | Mitani et al. | ................. 117/84 |

* cited by examiner

*Primary Examiner*—Tu-Tu V. Ho
(74) *Attorney, Agent, or Firm*—F. Chau & Assoc., LLC (57) ABSTRACT

A method of manufacturing a thin film transistor array panel is provided, which includes: depositing an amorphous silicon layer on an insulating substrate; converting the amorphous silicon layer to a polysilicon layer by a plurality of laser shots using a mask; forming a gate insulating layer on the polysilicon layer; forming a plurality of gate lines on the gate insulating layer; forming a first interlayer insulating layer on the gate lines; forming a plurality of data lines on the first interlayer insulating layer; forming a second interlayer insulating layer on the data lines; and forming a plurality of pixel electrodes on the second interlayer insulating layer, wherein the mask comprises a plurality of transmitting areas and a plurality of blocking areas arranged in a mixed manner.

4 Claims, 12 Drawing Sheets

| 1 | 4 | 3 | 5 |
|---|---|---|---|
| 3 | 2 | 4 | 1 |
| 5 | 4 | 1 | 2 |

| 1 | 4 | 3 | 5 |
|---|---|---|---|
| 3 | 2 | 4 | 1 |
| 5 | 4 | 1 | 2 |

⋮

⋮

| 1 | 4 | 3 | 5 |
|---|---|---|---|
| 3 | 2 | 4 | 1 |
| 5 | 4 | 1 | 2 |

| 1 | 4 | 3 | 5 |
|---|---|---|---|
| 3 | 2 | 4 | 1 |
| 5 | 4 | 1 | 2 |

POLYSILICON THIN FILM TRANSISTOR ARRAY PANEL AND MANUFACTURING METHOD THEREOF

CROSS-REFERENCE

This application is a continuation application of Applicant's U.S. patent application Ser. No. 10/752,510 filed on Jan. 8, 2004, now U.S. Pat. No. 6,906,349, which claims priority to and the benefit of Korean Patent Application No. 10-2003-0000971, filed on Jan. 8, 2003 and Korean Patent Application No. 10-2003-0008153, filed on Feb. 10, 2003, which are all hereby incorporated by reference for all purposes as if fully set forth herein.

BACKGROUND OF THE INVENTION (a) Field of the Invention

The present invention relates to a thin film transistor array panel and a manufacturing method thereof, and in particular, to a thin film transistor array panel for an organic electroluminescence display device.

(b) Description of the Related Art

Generally, an organic electro-luminescence (EL) display is a self emissive display device, which displays images by exciting an emissive organic material to emit light. The organic EL display includes an anode (hole injection electrode), a cathode (electron injection electrode), and an organic light emission layer interposed therebetween. When the holes and the electrons are injected into the light emission layer, they are recombined and pair annihilated with emitting light. The light emission layer further includes an electron transport layer (ETL) and a hole transport layer (HTL) as well as an electron injecting layer (EIL) and a hole injecting layer (HIL) for enhancing the light emission.

A plurality of pixels of the organic EL display, each including an anode, a cathode, and a light emission layer, are arranged in a matrix and driven in passive matrix (or simple matrix) addressing or active matrix addressing.

The passive matrix type organic EL display includes a plurality of anode lines, a plurality of cathode lines intersecting the anode lines, and a plurality of pixels, each including a light emission layer. The selection of one of the anode lines and one of the cathode lines cause light emission of a pixel located at the intersection of the selected signal lines.

The active matrix type organic EL display includes a plurality of pixels, each including a switching transistor and a driving transistor as well as an anode, a cathode, and a light emission layer. The EL display further includes a plurality of gate lines transmitting gate signals and a plurality of data lines transmitting data voltages. The switching transistor is connected to one of the gate lines and one of the data lines and transmits the data voltage from the data line in response to the gate signal. The driving transistor receives the data voltage from the switching transistor and drives a current depending on the data voltage. The current from the driving transistor enters the light emission layer to cause light emission having an intensity depending on the current. The color representation of the EL display is obtained by providing red, green and blue light emission layers.

The EL display significantly requires uniformity in characteristics of the driving transistors since the difference in the characteristics of the driving transistors results in the difference in the luminance of a display screen for the same gray.

The transistors may be polysilicon thin film transistors (TFTs) and the characteristics of the polysilicon TFTs significantly depend on a crystallization process. When using an examiner laser annealing (ELA), the illuminated areas are linear and non-uniform energy of the illumination steps may results in the linear areas with different device characteristics, which can be easily conceived. A sequential lateral solidification (SLS) improves the uniformity in the device characteristics of the TFTs, but it is not sufficient since the laser beam has inevitable energy deviation of about ±10%.

SUMMARY OF THE INVENTION

A thin film transistor array panel is provided, which includes: an insulating substrate including a plurality of pixel areas; a gate wire formed on the substrate; a first data wire insulated from the gate wire and intersecting the gate wire to define the pixel areas; a second data wire insulated from the gate wire and intersecting the gate wire; a plurality of pixel electrodes formed in the pixel areas; a plurality of switching thin film transistors connected to the gate wire and the data wire and including polysilicon members; and a plurality of driving thin film transistors connected to the switching thin film transistors, the pixel electrodes, and the second data wire and including polysilicon members, wherein the substrate includes a plurality of groups of divisional areas, each divisional area provided with the switching thin film transistors and the driving thin film transistors having substantially the same driving capacity, the switching thin film transistors and the driving thin film transistors in the divisional areas in one of the groups have different driving capacities, and the divisional areas in the different groups are mixed.

Preferably, nearest neighbors of the divisional areas belong to the different groups, and next nearest neighbors of the divisional areas belong to the same group.

Each pixel area may include one of the divisional areas.

The polysilicon members of the switching thin film transistors and the driving thin film transistors having different driving capacities may have different crystalline characteristics.

A thin film transistor array panel is provided, which includes: an insulating substrate including a plurality of pixel areas; a plurality of polysilicon members provided on the pixel areas; a gate insulating layer formed on the polysilicon members; a gate wire formed on the gate insulating layer; a first interlayer insulating layer formed on the gate wire; a data wire formed on the first interlayer insulating layer and intersecting the gate wire to define the pixel areas; a second interlayer insulating layer formed on the data wire; and a plurality of pixel electrodes formed on the second interlayer insulating layer and disposed in the pixel areas, wherein the substrate includes a plurality of groups of divisional areas, each divisional area provided with the polysilicon members having substantially the same driving capacity, the polysilicon members in the divisional areas in one of the groups have different driving capacities, and the divisional areas in the different groups are mixed.

The thin film transistor array panel may further include: a plurality of organic light emitting members formed on the pixel electrodes; a plurality of partitions formed on the pixel electrodes and defining areas occupied by the light emitting members; and a common electrode formed on the light emitting members and the partitions.

Preferably, the polysilicon members comprises a plurality of switching transistor portions including channel regions and source and drain regions, a plurality of driving transistor portions including channel regions and source and drain regions, and a plurality of storage electrode portions connected to the driving transistor portions; the gate wire comprises a plurality of first gate electrodes, a plurality of second gate electrodes, and a plurality of storage electrodes overlapping the switching transistor portions, the driving transistor portions, and the storage electrode portions, respectively; wherein the data wire comprises a plurality of first and second data lines, a plurality of first source electrodes connected to the first data lines and the source regions of the switching transistor portions, a plurality of first drain electrodes connected to the drain regions of the switching transistor portions and the second gate electrodes, and a plurality of second source electrodes connected to the second data lines and the source regions of the driving transistor portions; and the pixel electrodes are connected to the drain regions of the driving transistor portions.

A method of manufacturing a thin film transistor array panel is provided, which includes: depositing an amorphous silicon layer on an insulating substrate; converting the amorphous silicon layer to a polysilicon layer by a plurality of laser shots using a mask; forming a gate insulating layer on the polysilicon layer; forming a plurality of gate lines on the gate insulating layer; forming a first interlayer insulating layer on the gate lines; forming a plurality of data lines on the first interlayer insulating layer; forming a second interlayer insulating layer on the data lines; and forming a plurality of pixel electrodes on the second interlayer insulating layer, wherein the mask comprises a plurality of transmitting areas and a plurality of blocking areas arranged in a mixed manner.

The method may further include: forming a plurality of partitions on the pixel electrodes; forming a plurality of organic light emitting members on the pixel electrodes in areas defined by the partitions; and forming a common electrode on the light emitting layer.

The transmitting areas and the blocking areas of the mask preferably have areas and shapes determined by at least one pixel areas.

The transmitting areas and the blocking areas are preferably arranged such that each of the transmitting areas is adjacent to the blocking areas in a transverse direction and in a longitudinal direction and adjacent to other transmitting areas in a diagonal direction.

The mask includes at least two blocks including the transmitting areas and the blocking areas, the transmitting areas and the blocking areas in different blocks are differently arranged. The conversion includes: moving the mask by a distance equal to a width of each block; and illuminating a laser beam through the mask.

Preferably, the transmitting areas included in all of the blocks form a complete block.

A silicon crystallization method is provided, which includes: depositing an amorphous silicon layer on an insulating substrate; melting the amorphous silicon layer by illuminating a laser beam through a mask including a plurality of transmitting areas and a plurality of blocking areas; and crystallizing the melted amorphous silicon layer, wherein at least a boundary of the blocking areas and the transmitting areas has a stepwise shape.

The at least a boundary preferably forms either an upper boundary or a lower boundary of one of the transmitting areas.

The transmitting areas may include a plurality of stepwise slits having a stepwise boundary and having lengths and widths and arranged in their width direction.

The transmitting areas may further include a plurality of rectangular slits arranged to form a column, and the stepwise slits are arranged to form another column.

Preferably, the stepwise slits and the rectangular slits are arranged offset.

A mask for silicon crystallization using a laser beam is provided, which includes: a plurality of transmitting areas for transmitting the laser beam; and a plurality of blocking areas for blocking the laser beam, wherein at least a boundary of the transmitting areas and the blocking areas has a stepwise shape.

A method of manufacturing an electroluminescent display device including a plurality of switching thin film transistors, a plurality of driving thin film transistors, and a plurality of organic light emitting members is provided, which includes: depositing an amorphous silicon layer for the driving thin film transistors; melting the amorphous silicon layer by illuminating a laser beam through a mask including a plurality of transmitting areas and a plurality of blocking areas; and crystallizing the melted amorphous silicon layer, wherein at least a boundary of the blocking areas and the transmitting areas has a stepwise shape.

BRIEF DESCRIPTION OF THE DRAWINGS

The present invention will become more apparent by describing embodiments thereof in detail with reference to the accompanying drawings in which.

DETAILED DESCRIPTION OF EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, film, region, substrate or panel is referred to as being "on" another element, it can be directly on the other element or intervening elements may also be present. In contrast, when an element is referred to as being "directly on" another element, there are no intervening elements present.

Then, thin film transistor array panels for an organic electroluminescence display device and manufacturing methods thereof according to embodiments of the present invention will be described with reference to the accompanying drawings.

Figure 1:
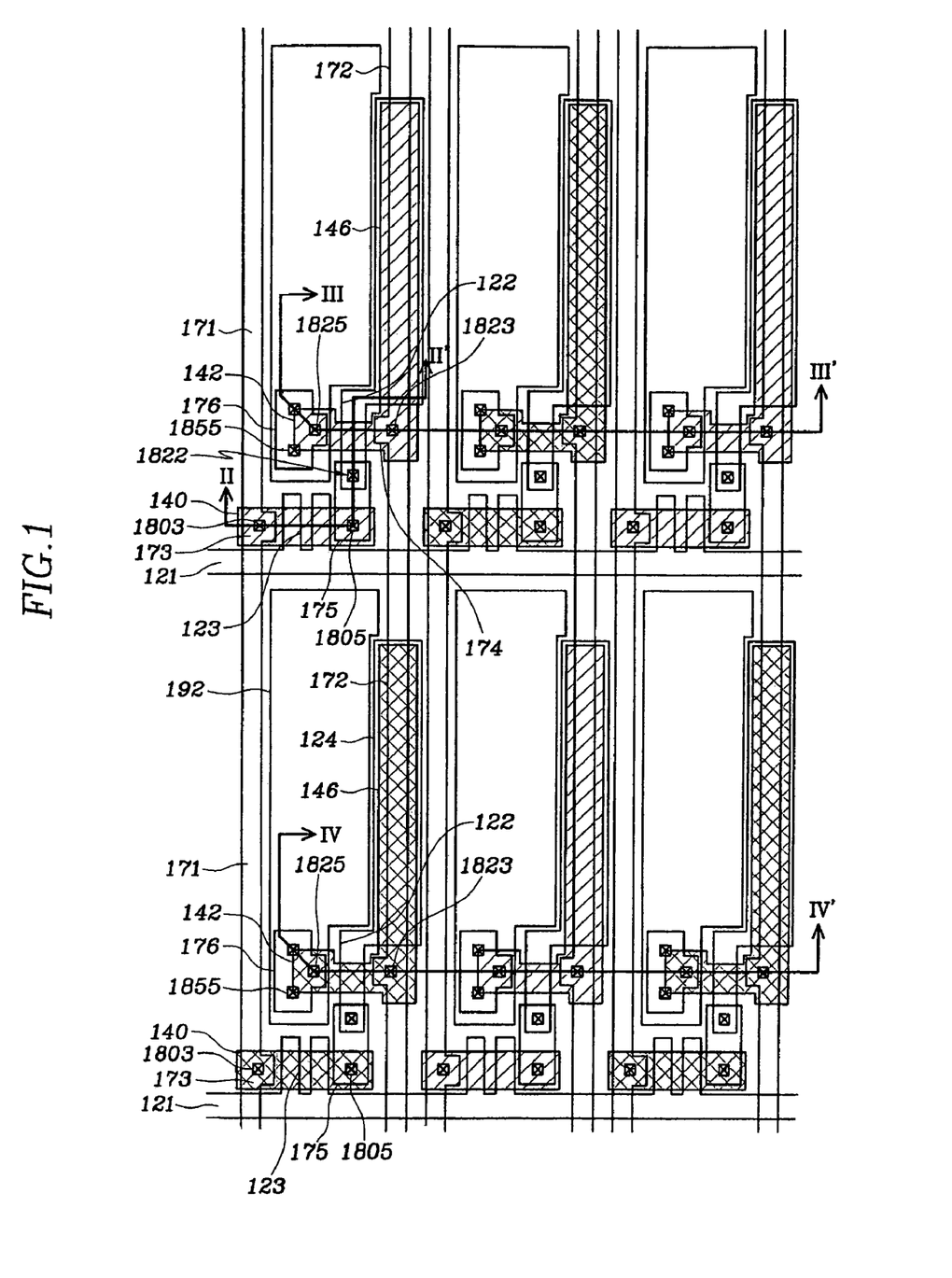
FIG. 1 is a layout view of a TFT array panel for an organic EL display according to an embodiment of the present invention.
Figure 2:
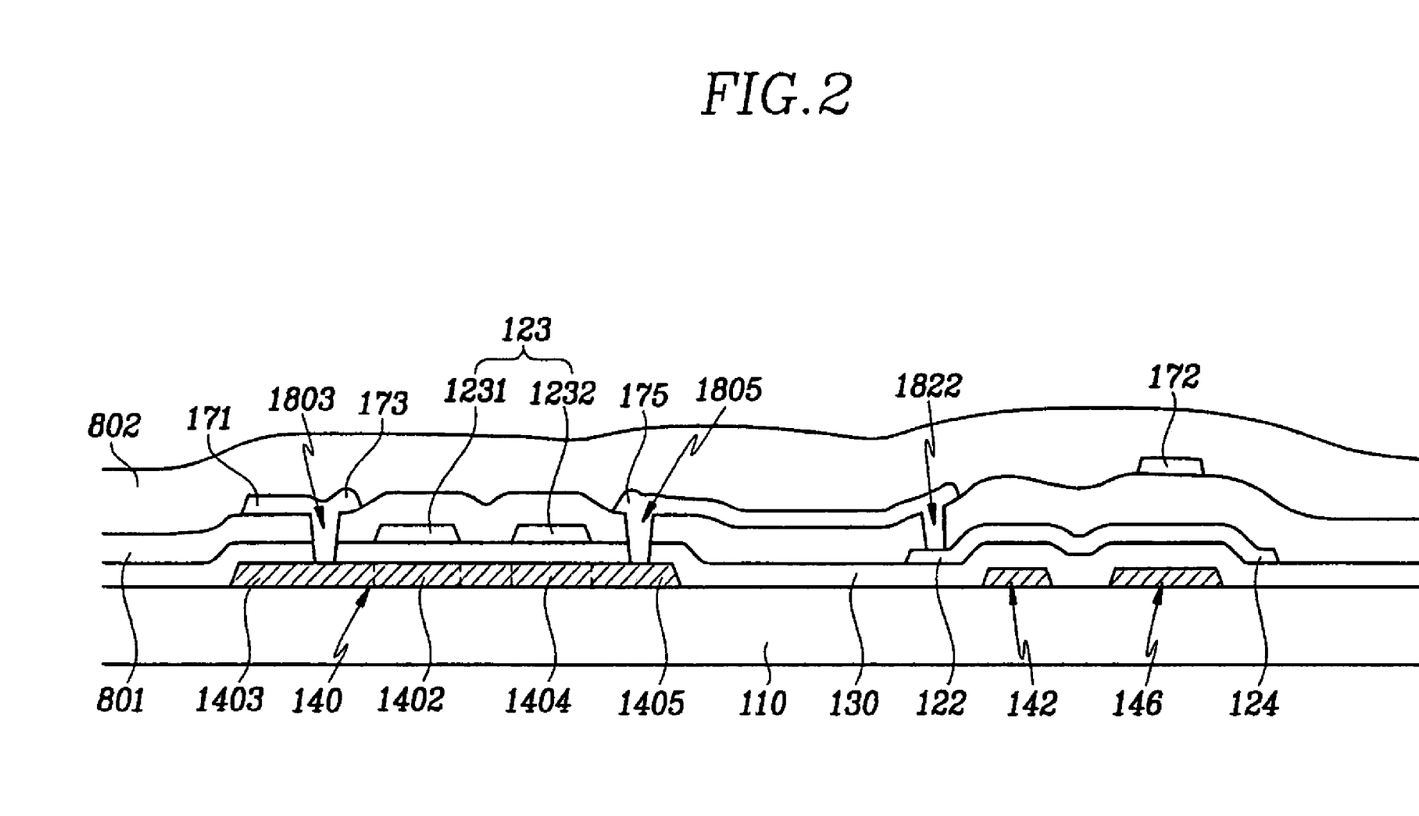
FIG. 2 is a sectional view of the TFT array panel shown in FIG. 1 taken along the line II-II'.
Figure 3:
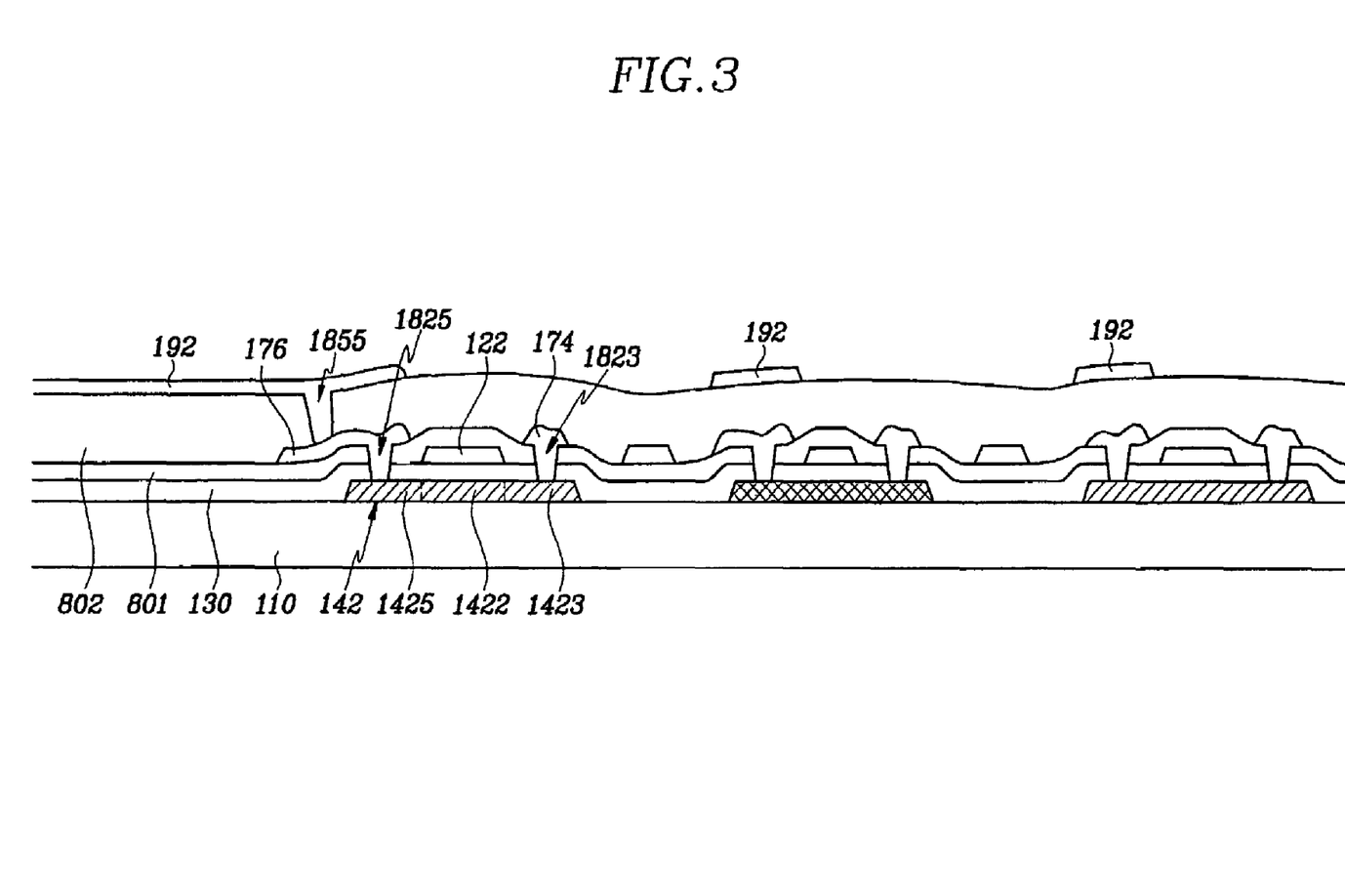
FIG. 3 is a sectional view of the TFT array panel shown in FIG. 1 taken along the line III-III'.
Figure 4:
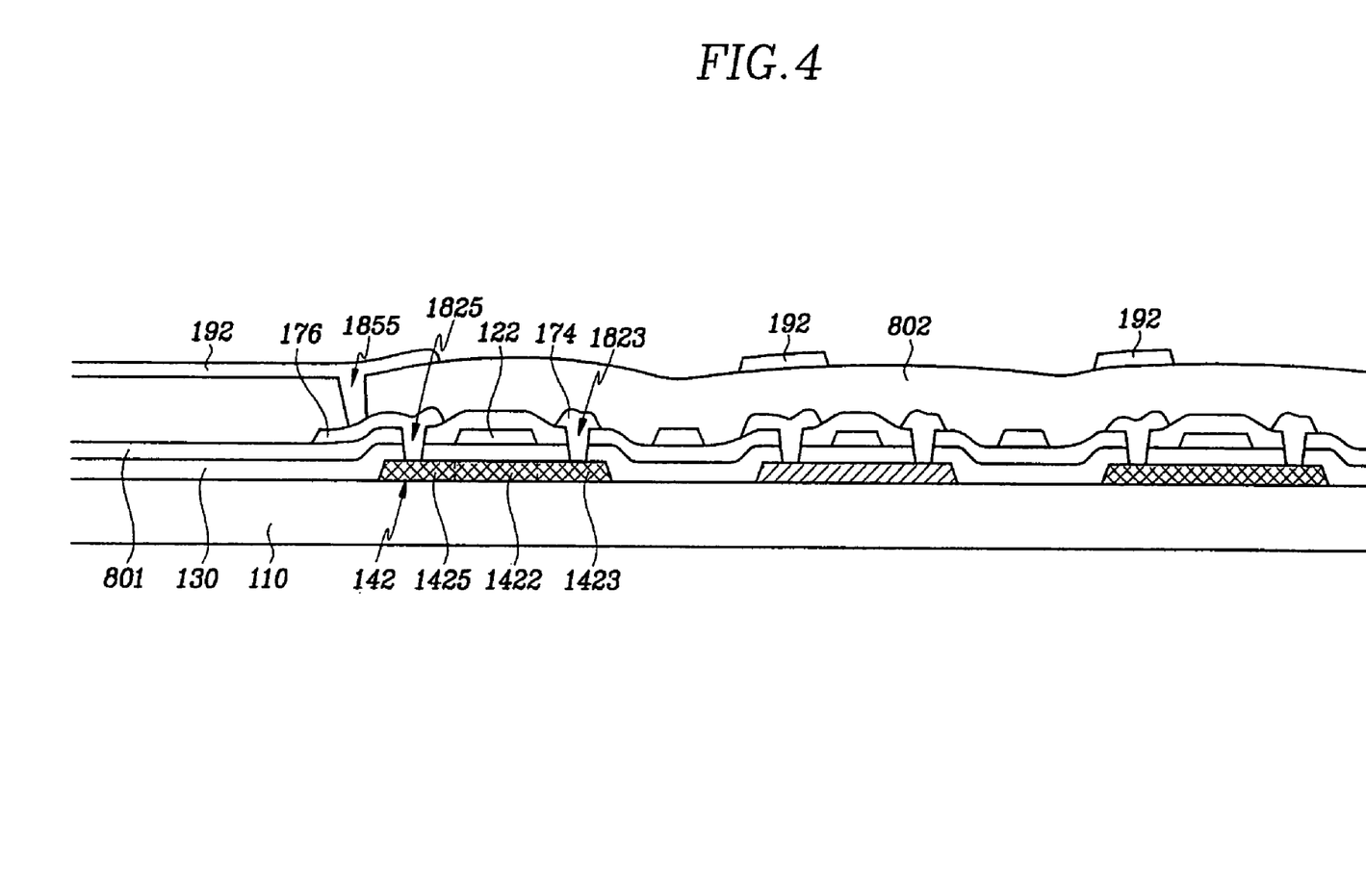
FIG. 4 is a sectional view of the TFT array panel shown in FIG. 1 taken along the line IV-IV'.

FIG. 1 is a layout view of a TFT array panel for an organic EL display according to an embodiment of the present invention, FIG. 2 is a sectional view of the TFT array panel shown in FIG. 1 taken along the line II-II', FIG. 3 is a sectional view of the TFT array panel shown in FIG. 1 taken along the line III-III', and FIG. 4 is a sectional view of the TFT array panel shown in FIG. 1 taken along the line IV-IV'.

A semiconductor layer preferably made of polysilicon is formed on an insulating substrate 110. The semiconductor layer includes a plurality of switching TFT portions 140 and a plurality of driving TFT portions 142. Each switching TFT portion 140 includes a plurality of impurity regions such as a source region 1403, an intermediate region, and a drain region 1405, which are doped with n type impurity and separated from one another, and a plurality of intrinsic regions such as a pair of channel regions 1402 and 1404 disposed between the impurity regions 1403 and 1405. Each driving TFT portion 142 a plurality of impurity regions such as a source region 1423 and a drain region 1425, which are doped with p type impurity and separated from each another, and an intrinsic region such as a channel region 1422 disposed between the impurity regions 1423 and 1425. The source region 1423 extends to form a storage electrode region 146.

Alternatively, the impurity regions 1403 and 1403 of the switching TFT portion 140 are doped with p type impurity, while the impurity regions 1423 and 1425 of the driving transistor portion 150*b* are doped with n type impurity, depending on driving conditions.

The semiconductor layer 140 and 142 may have different crystalline characteristics depending on the position.

For example, the pixel areas adjacent in a diagonal direction have substantially the same crystalline characteristics, while the pixel areas adjacent in a transverse direction and a longitudinal direction have different crystalline characteristics.

The portions of the semiconductor layer 140 and 142 indicated by the same hatching in FIG. 1 have substantially the same crystalline characteristics.

A blocking layer (not shown) preferably made of silicon oxide or silicon nitride may be disposed under the semiconductor layer 140 and 142.

A gate insulating layer 130 preferably made of silicon oxide or silicon nitride is formed on the semiconductor layer 140 and 142.

A plurality of gate lines 121 including a plurality of first gate electrodes 123 and a plurality of second gate electrodes 122, which are preferably made of low resistivity material such as Ag, Ag alloy, Al or Al alloy, are formed on the gate insulating layer 140. The gate lines 121 may have a multi-layered structure including a low resistivity layer. Each first gate electrode 123 includes a pair of switching electrode portions 1231 and 1232 branched from the gate line 121 and they intersect the switching TFT portion 140 such that they overlap the pair of the channel regions 1402 and 1404. Each second gate electrode 122 is separated from the gate line 121 and it intersects the driving TFT portion 142 such that it overlaps the channel region 1422. The second gate electrode 122 extends to form a storage electrode 124 overlapping the storage electrode region 146 of the semiconductor layer 140 and 142 to form a storage capacitor.

The gate lines 121 may further include a plurality of gate pads (not shown) connected at an end of the gate lines for receiving gate signals from an external device. The storage electrodes 124 overlap the storage electrode regions 146 or second data lines 172, which will be described layer, to form a plurality of storage capacitors. The gate lines 121 having a multi-layered structure preferably include a material having good contact characteristics with other materials.

A first interlayer insulating film 801 preferably made of silicon nitride, silicon oxide or organic insulator is formed on the gate lines 121 and the first and the second gate electrodes 121 and 123.

A plurality of data lines 171 including a plurality of first source electrodes 173, a plurality of supply voltage lines 172 including a plurality of second source electrodes 174, and a plurality of first and second drain electrodes 175 and 176 are formed on the first interlayer insulating film 801.

The data lines 171 substantially extending in a longitudinal direction, the supply voltage lines 172 substantially extending in the longitudinal direction, and the first and second drain electrodes 175 and 176 are preferably made of low resistivity material such as Ag, Ag alloy, Al or Al alloy, or alternatively, they may have a multi-layered structure including a low resistivity layer.

Each first source electrode 173 is branched from the data line 171 and connected to the source region 1403 of the switching TFT portions 140 through a contact hole 1803 penetrating the first interlayer insulating film 801 and the gate insulating layer 130. Each first drain electrode 175 is connected to the drain region 1405 of the switching TFT portions 140 through a contact hole 1805 penetrating the first interlayer insulating film 801 and the gate insulating layer 130. The first drain electrode 175 is also connected to the second gate electrode 122 through a contact hole 1822 penetrating the first interlayer insulating film 801 and the gate insulating layer 130.

Each second source electrode 174 is branched from the supply voltage line 172 and it is connected to the source region 1423 of the driving TFT portion 142 through a contact hole 1823 penetrating the first interlayer insulating film 801 and the gate insulating layer 130. Each second drain electrode 176 is connected to the second drain region 1425 through a contact hole 1825 penetrating the first interlayer insulating film 801 and the gate insulating layer 130.

The data lines 171 and the supply voltage lines 172 may include a plurality of expansions to be connected to an external circuit.

A second interlayer insulating film 802 is formed on the data lines 171, the supply voltage lines 172, and the drain electrodes 175 and 176. The second interlayer insulating film 802 is preferably made of silicon nitride, silicon oxide, or organic insulating material and it has a plurality of contact holes 185 exposing the second drain electrodes 176.

A plurality of pixel electrodes 192 are formed on the second interlayer insulating film 802. Each pixel electrode 192 is connected to the second drain electrode 176 through the contact hole 1855 and it is preferably made of a transparent conductive material such as ITO (indium tin oxide) and IZO (indium zinc oxide).

The TFT array panel may further include a plurality of partitions (not shown) surrounding the pixel electrodes 192 for separating pixels of the organic EL display panel, which is preferably made of organic material, a plurality of red, green and blue light emitting members (not shown) formed on the pixel electrodes 192 and disposed in the depressions defined by the partitions, and a common electrode (not shown) formed on the light emitting members and the partitions.

As described above, the crystalline characteristics of the semiconductor layer 140 and 142 are uniform in the diagonal direction, while they are different in the transverse direction and the longitudinal direction. Accordingly, the TFTs having different driving capacities are distributed in a mixed manner to prevent the conception of stripes between the areas provided with the TFTs having different driving capacities.

A manufacturing method of the TFT array panel for an organic EL display device shown in FIGS. 1-4 according to an embodiment of the present invention is described in detail with reference to FIGS. 5-7 as well as FIGS. 1-4.

Figure 5:
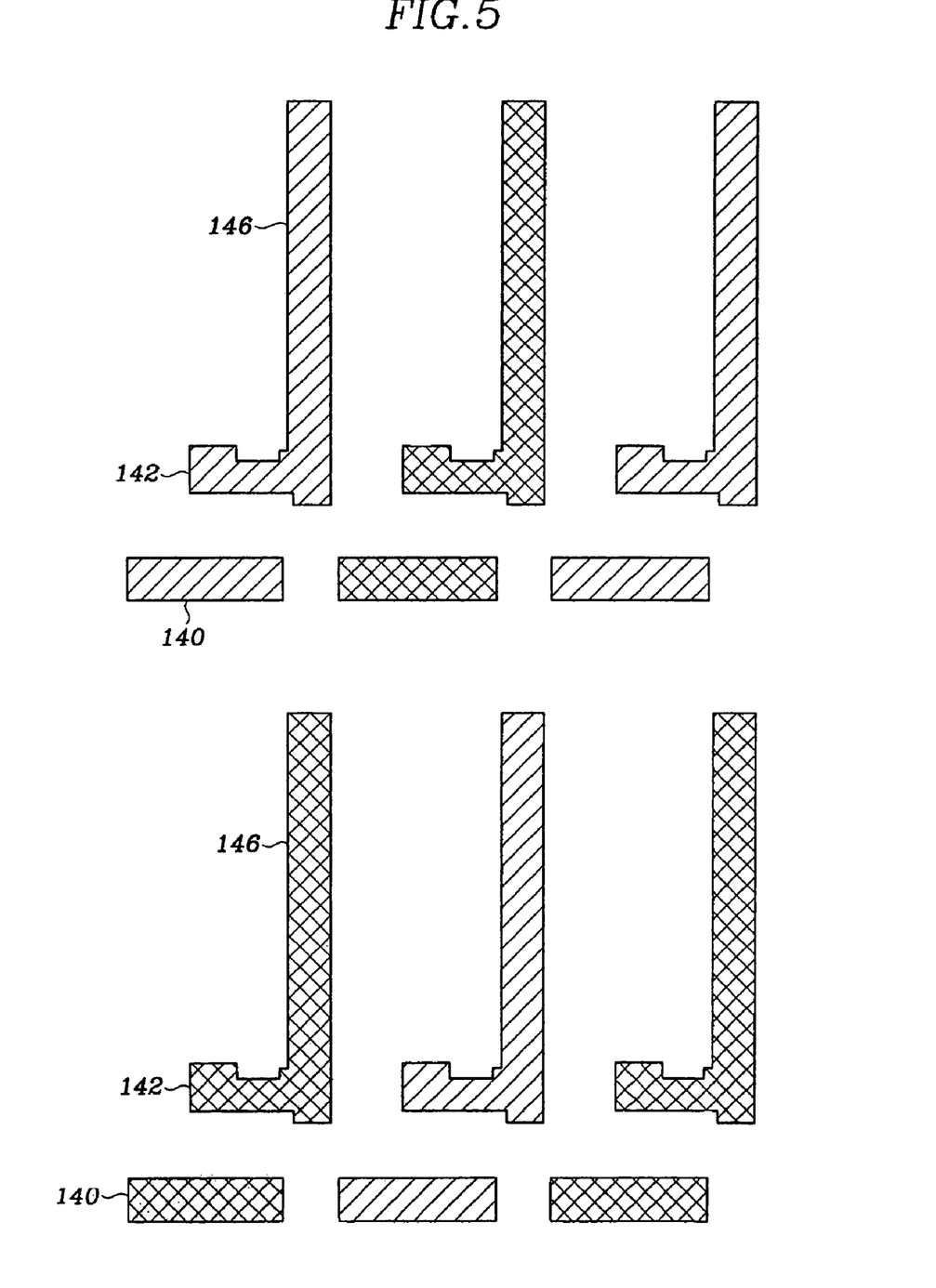
FIG. 5 is a layout view of polysilicon members formed by a method of manufacturing method of a TFT array panel according to an embodiment of the present invention.
Figure 6:
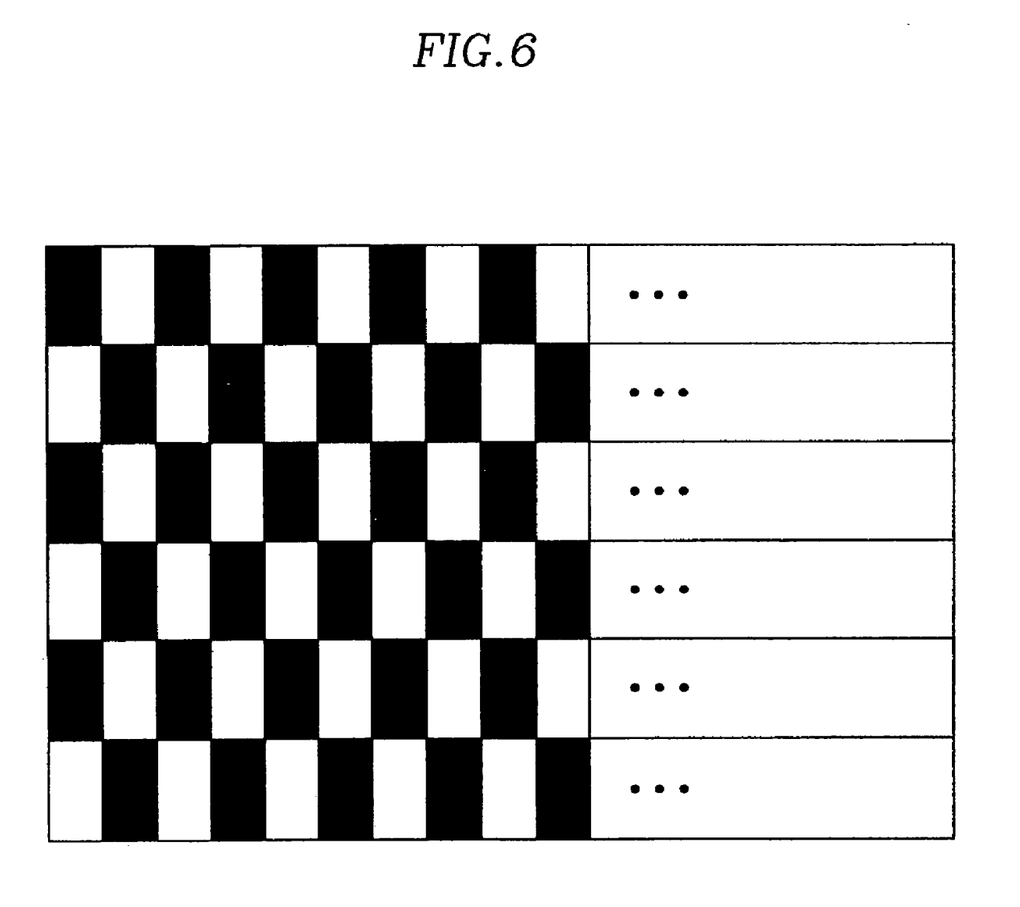
FIG. 6 is a layout view of a laser illumination mask for forming the polysilicon members shown in FIG. 5.
Figure 7:
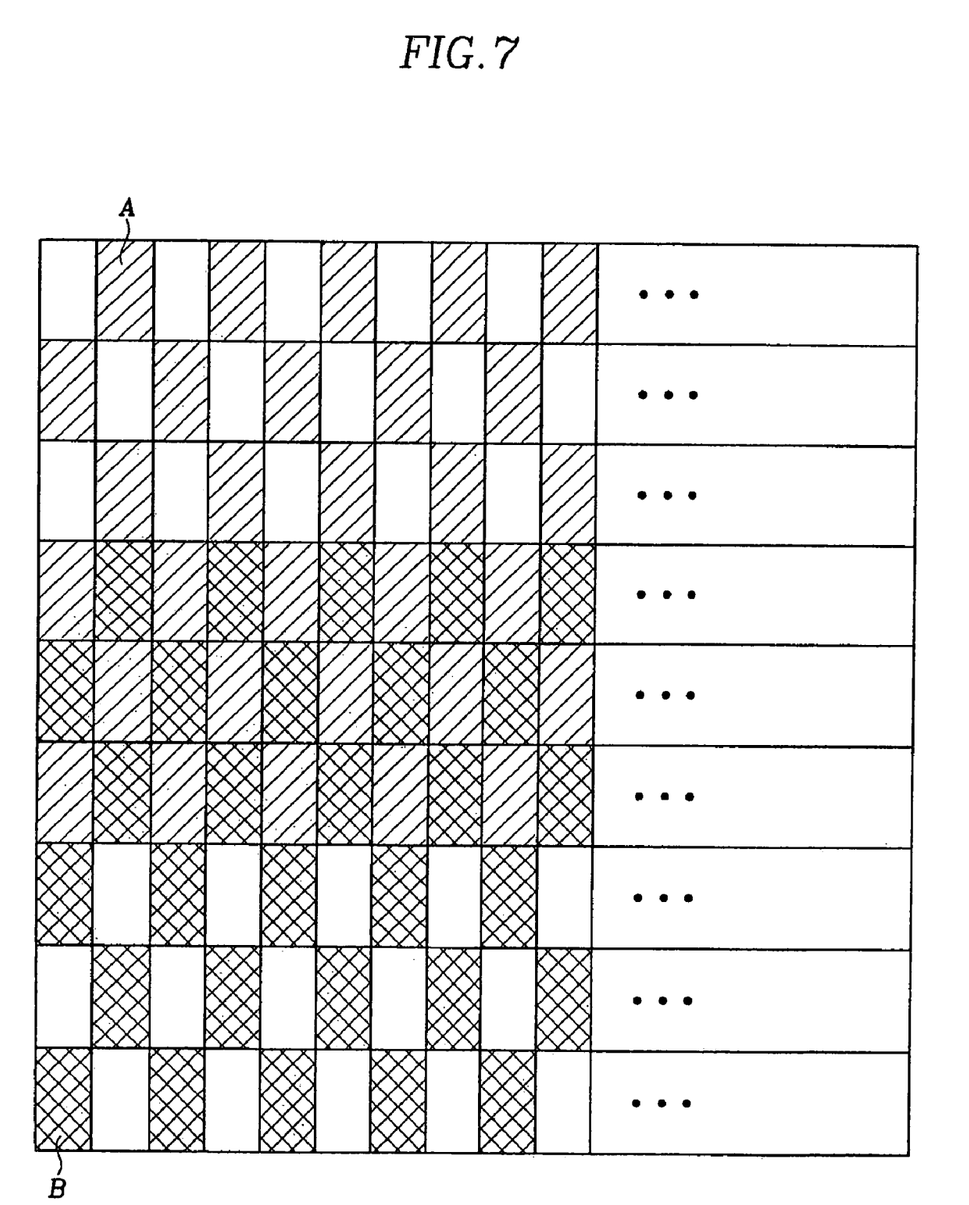
FIG. 7 illustrates laser illumination on an amorphous silicon layer using the mask shown in FIG. 6.

FIG. 5 is a layout view of polysilicon members formed by a method of manufacturing method of a TFT array panel according to an embodiment of the present invention, FIG. 6 is a layout view of a laser illumination mask for forming the polysilicon members shown in FIG. 5, and FIG. 7 illustrates laser illumination on an amorphous silicon layer using the mask shown in FIG. 6.

First, a blocking layer (not shown) preferably made of silicon oxide is formed on an insulating substrate 110 and an amorphous silicon layer is deposited on the blocking layer. The deposition of the amorphous silicon layer is preferably performed by LPCVD (low temperature chemical vapor deposition), PECVD (plasma enhanced chemical vapor deposition) or sputtering.

Consecutively, the amorphous silicon layer is laser-annealed to be crystallized into a polysilicon layer. The laser annealing of the amorphous silicon layer is performed by using a mask shown in FIG. 6.

Referring to FIG. 6, white areas of the mask transmit the laser beam, while black areas block the laser beam. Each transmitting area and each blocking area may correspond to a pixel area or a plurality of pixel areas.

The mask shown in FIG. 6 is aligned with the substrate 110 and a laser beam is illuminated through the mask. Portions of the amorphous silicon layer exposed to the laser beam are melted, while portions of the amorphous silicon layer under the blocking areas of the mask are not melted. The laser illumination may be performed once with an energy sufficient for melting the amorphous silicon layer, or it may be performed several times with an weaker energy to melt the amorphous silicon layer.

Thereafter, the mask is moved in a direction and a laser beam is illuminated again. The moving direction of the mask may be transverse, longitudinal or diagonal. The mask covers some area covered with the mask in the previous illumination step, and some of the portions of the amorphous silicon layer blocked by the blocking areas of the mask in the previous illumination step are exposed to the laser beam.

For example, FIG. 7 illustrates portions (indicated by reference numeral A) of the amorphous silicon layer exposed to the laser beam in an illumination step and portions (indicated by reference numeral B) of the amorphous silicon layer exposed to the laser beam in a next illumination step.

In this way, all portions of the amorphous silicon layer are melted to be poly-crystallized and the polysilicon layer is photo-etched to form a plurality of pairs of switching TFT portions 140 and driving TFT portions 142. Consequently, the polycrystalline characteristics of the portions adjacent in the transverse direction and the longitudinal direction are different, while the polycrystalline characteristics of the portions adjacent in the diagonal direction are the same as shown in FIG. 5.

A gate insulating layer 130 is deposited on the polysilicon layer 140 and 142.

Successively, a gate metal layer is deposited on the gate insulating layer 130 and a photoresist film (not shown) is coated, exposed to light, and developed to form a first photoresist. The gate metal layer is etched by using the first photoresist as an etch mask to form a plurality of gate electrodes 122 including storage electrodes 124 and a plurality of gate metal members (not shown). P type impurity is injected into exposed portions of the driving TFT portions 142 of the polysilicon layer to form a plurality of P type impurity regions 1423 and 1425. At this time, the switching TFT portions 140 of the polysilicon layer are covered with the first photoresist and the gate metal members to be protected from impurity implantation.

The first photoresist is removed and another photoresist film is coated, exposed to light, and developed to form a second photoresist. The gate metal layer is etched by using the first photoresist as an etch mask to form a plurality of gate lines 121 including gate electrodes 123. N type impurity is injected into exposed portions of the switching TFT portions 140 of the polysilicon layer to form a plurality of N type impurity regions 1403 and 1405. At this time, the driving TFT portions 142 of the polysilicon layer are covered with the second photoresist to be protected from impurity implantation.

A first interlayer insulating film 801 is deposited on the gate lines 121 and the gate electrodes 123 and 122. The first interlayer insulating film 801 and the gate insulating layer 130 are photo-etched form a plurality of contact holes 1803, 1805, 1823 and 1825 exposing the impurity regions 1403, 1405, 1423 and 1425, respectively, as well as a plurality of contact holes 1822 exposing the gate electrodes 122.

Referring to FIGS. 1-4, a data metal layer is deposited and photo etched to form a plurality of data lines 171 including first source electrodes 173, a plurality of supply voltage lines 172 including a plurality of second source electrodes 174, a plurality of first and second drain electrodes 175 and 176.

A second interlayer insulating film 802 is deposited on the data lines 171, the supply voltage lines 172, and the drain electrodes 175 and 176 as well as on the first interlayer insulating film 801. The second interlayer insulating film 802 is photo-etched to form a plurality of contact holes 1855 exposing the second drain electrodes 176.

A transparent conductive material such as ITO and IZO or a reflective material such as Al and Ag is deposited and patterned to form a plurality of pixel electrodes 192.

An organic film containing black pigment is coated on the pixel electrodes 192 and the second interlayer insulating film 802, and it is exposed to light and developed to form a plurality of partitions defining a plurality of depressions on the pixel electrodes 192. Thereafter, a plurality of organic light emitting members are formed in the depressions by deposition or inkjet printing following a masking. The organic light emitting member 70 preferably has a multi-layered structure.

Next, an organic conductive material is deposited on the light emitting members to form a buffer layer, and ITO or IZO is deposited on the buffer layer to form a common electrode.

An auxiliary electrode (not shown) made of low resistivity material such as Al may be formed before or after the formation of the transparent common electrode.

A top emission type organic EL display panel includes an opaque pixel electrode and a transparent common electrode, while a bottom emission type organic EL display panel includes a transparent pixel electrode and an opaque common electrode.

Figure 8:
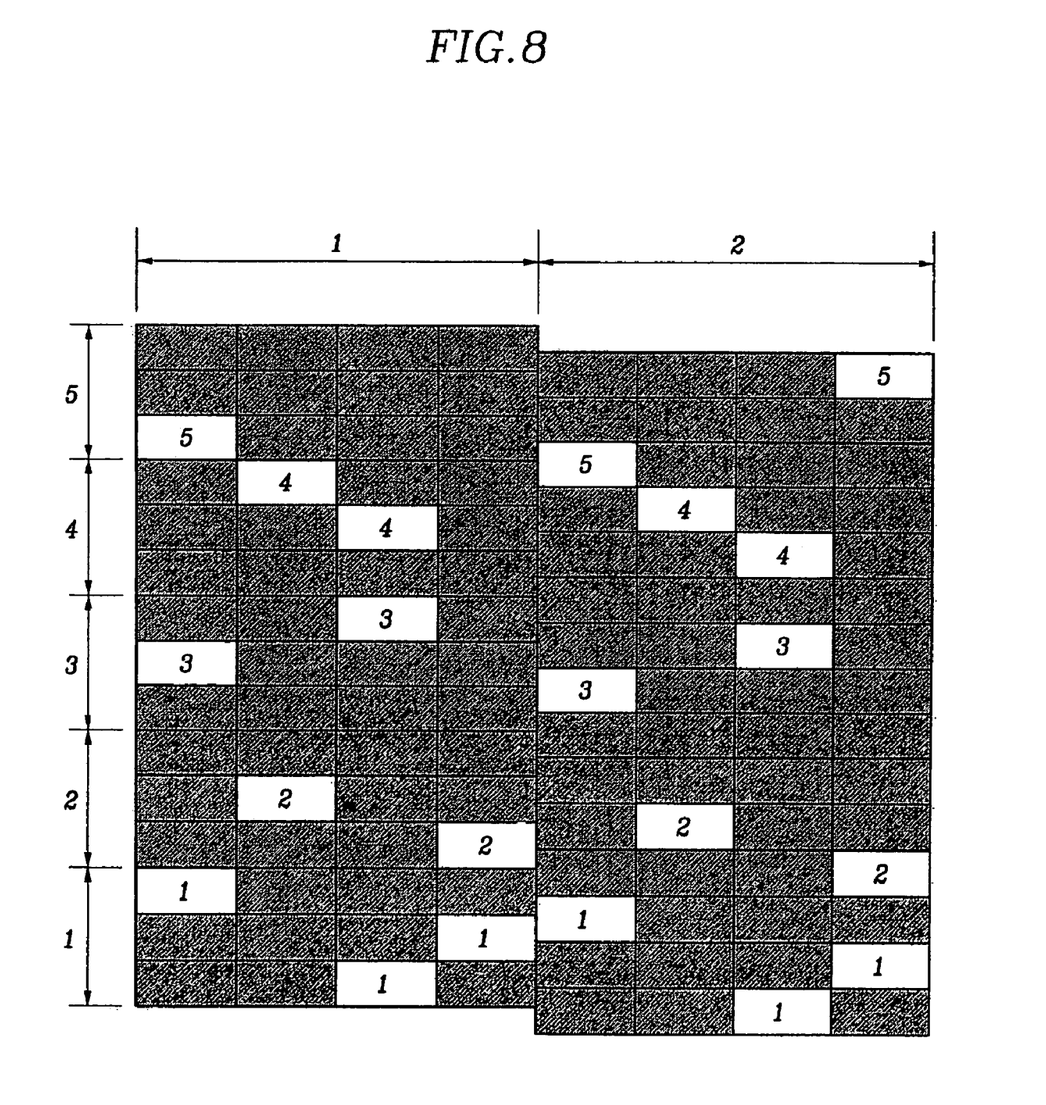
FIG. 8 is a layout view of a mask according to another embodiment of the present invention.

FIG. 8 is a layout view of a mask according to another embodiment of the present invention.

As shown in FIG. 8, a mask for laser illumination according to another embodiment of the present invention includes two columns arranged in a transverse direction and each column includes five blocks arranged in a longitudinal direction. Although the two columns are somewhat offset, their transmitting areas are arranged in the same manner. The five blocks have transmitting areas arranged in a different manner and their transmitting areas can form a complete block.

The arrangements of the transmitting areas may be varied.

Figure 9:
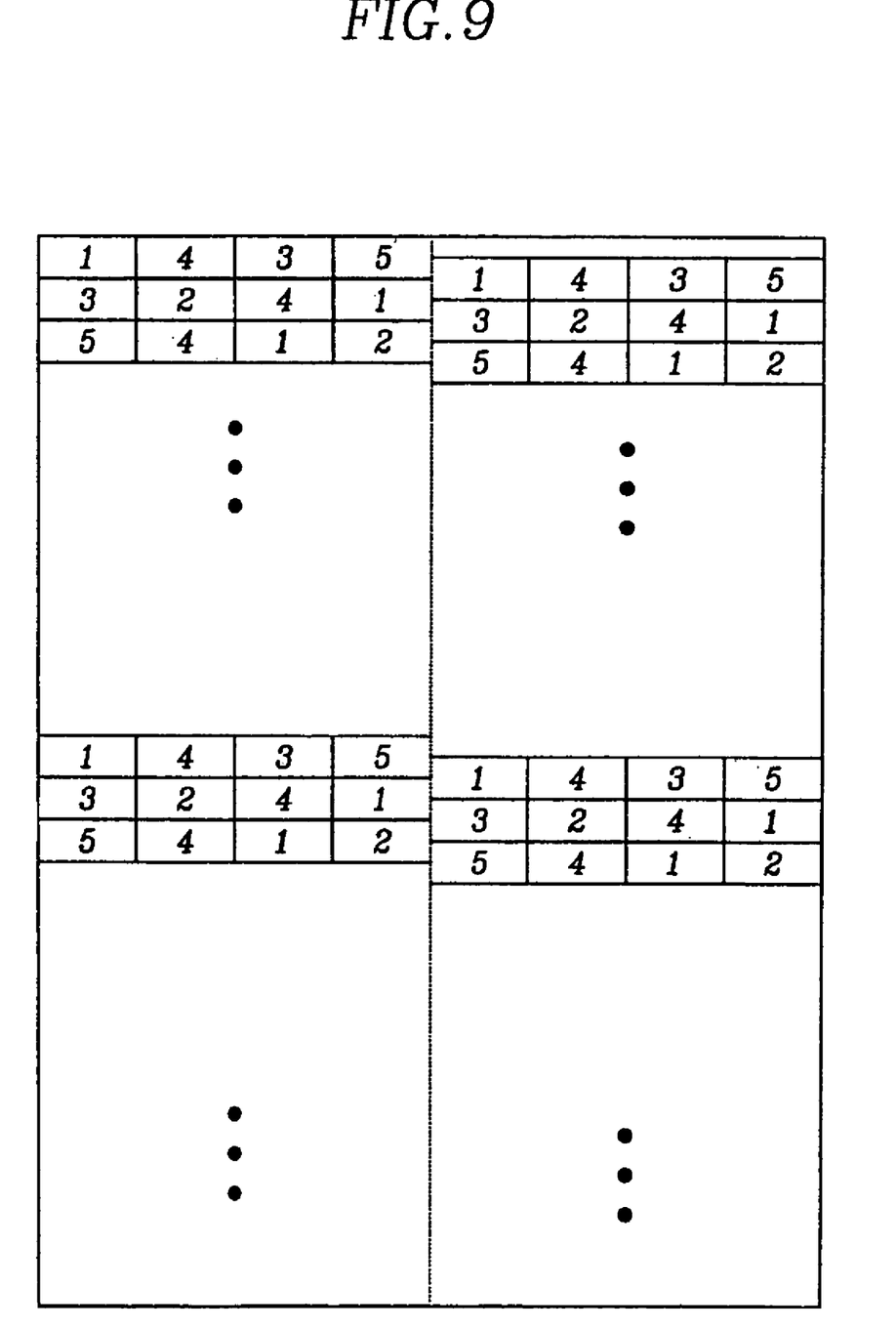
FIG. 9 illustrates a method for illuminating a laser beam through the mask shown in FIG. 8.

FIG. 9 illustrates a method for illuminating a laser beam through the mask shown in FIG. 8.

The mask is aligned with a silicon layer and the silicon layer is laser illuminated through the mask.

The mask moves down by a distance equal to a longitudinal width of a block and the silicon layer is laser illuminated through the mask.

In this way, the step-and-repeat is performed five times to crystallize all portions of the amorphous silicon layer.

The laser annealing according to this embodiment make an area of the silicon layer have several crystalline characteristics.

The number of the step-and-repeat is not limited to above-described embodiments. For example, the step-and-repeat is ten times performed by providing ten blocks including transmitting areas forming a complete block.

Figure 10A:
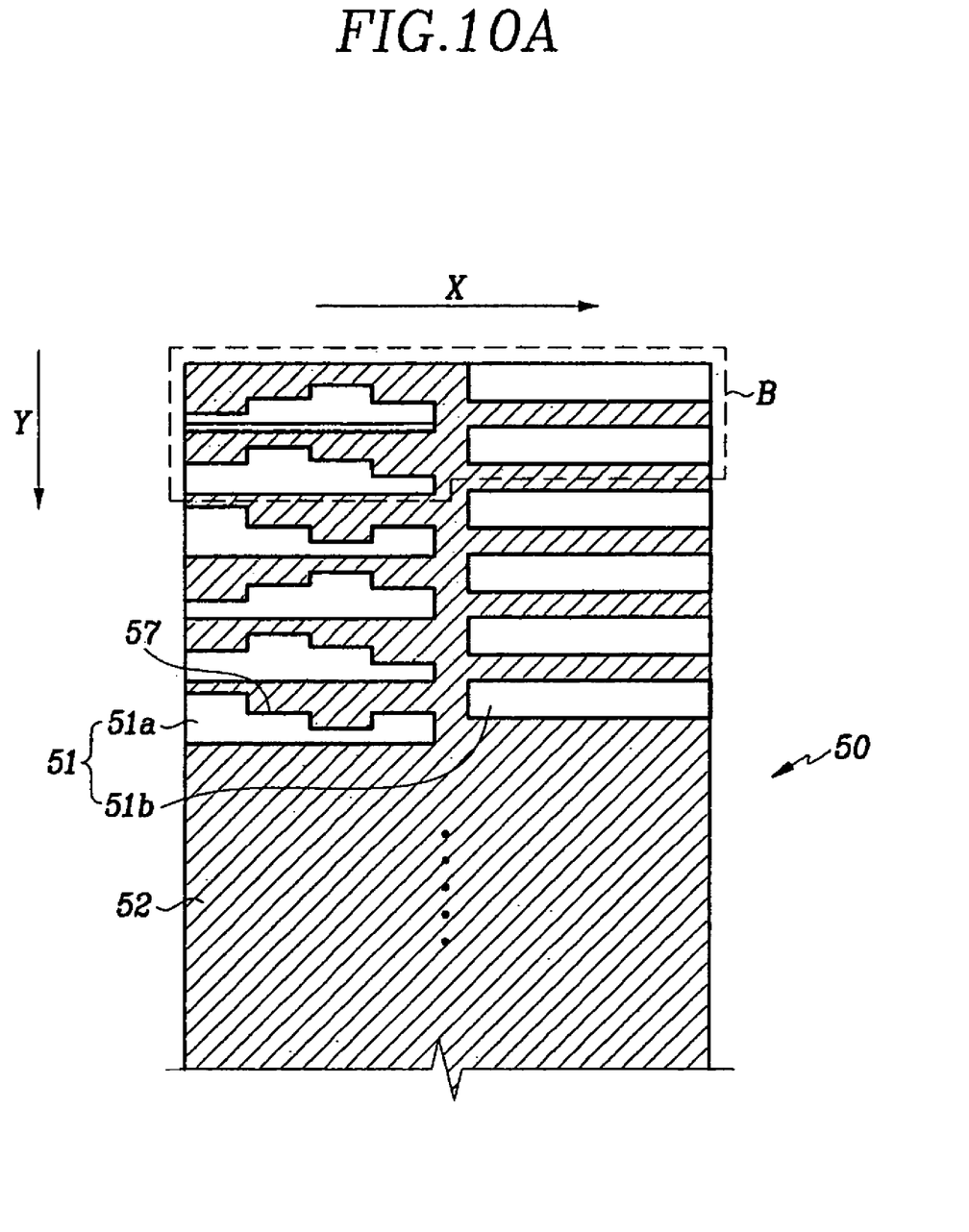
FIG. 10A shows a crystallization mask according to another embodiment of the present invention.
Figure 10B:
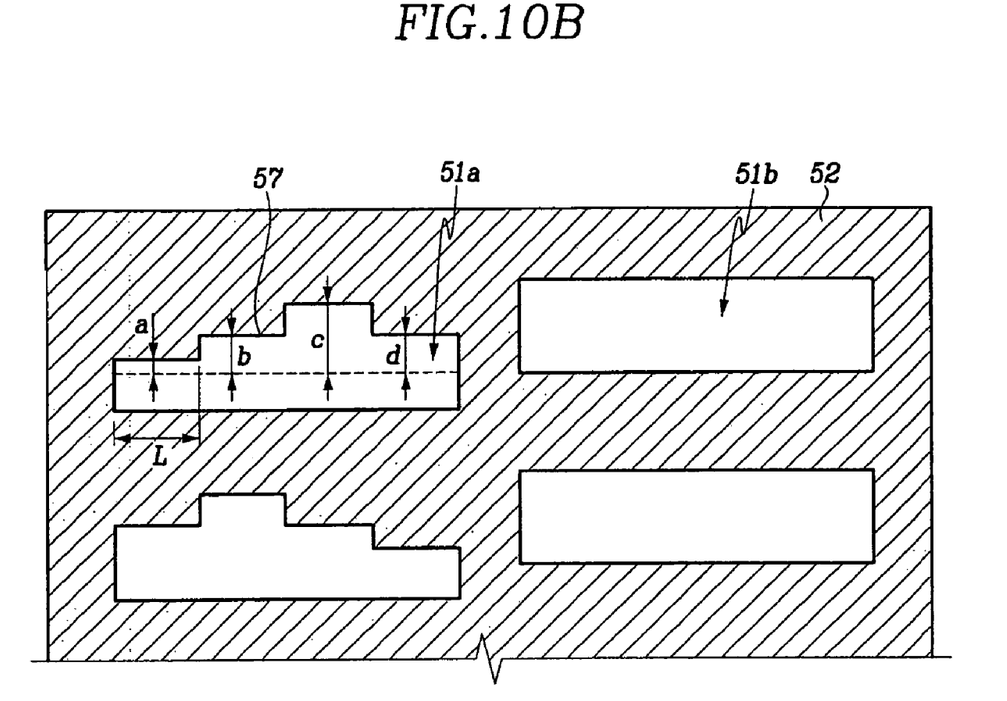
FIG. 10B is an enlarged view of FIG. 10A.

FIG. 10A shows a crystallization mask according to another embodiment of the present invention, and FIG. 10B is an enlarged view of FIG. 10A.

The mask includes a plurality of slits 51 for transmitting a laser beam and a blocking area 52 for blocking the laser beam.

The slits 51 include stepwise slits 51a arranged to form a column and rectangular silts 51b arranged to form another column.

As shown in FIGS. 10A and 10B, a boundary 57 of each stepwise slit 51a has a stepwise shape. The steps in the slit 51a gradually lower down and/or elevate up. The stepwise boundary 57 of the stepwise slit 51a forms an upper boundary. However, it may form a lower boundary of the slit 51a.

The stepwise slits 51a and the rectangular slits 51b are arranged offset in the transverse direction.

Figure 11:
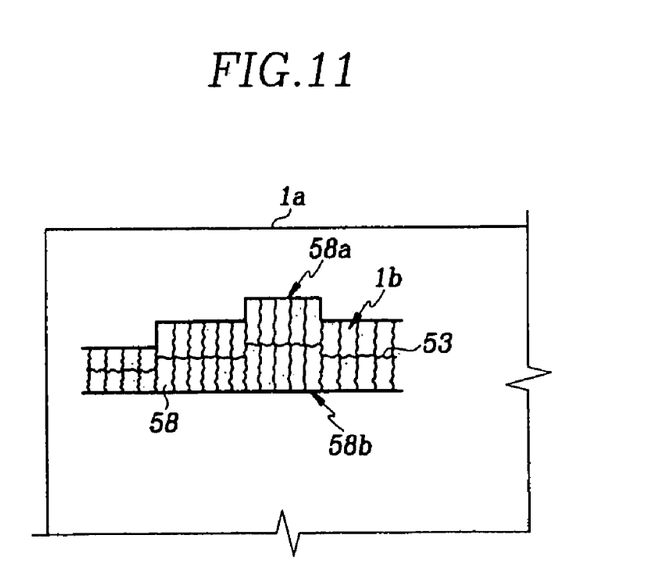
FIG. 11 illustrates a crystallized silicon layer made by using the mask shown in FIG. 10.

FIG. 11 illustrates a crystallized silicon layer made by using the mask shown in FIG. 10.

The amorphous silicon layer is exposed to a laser beam through the mask disposed thereon such that portions illuminated by the laser beam are melted to be liquefied. The laser beam has a high energy sufficient for completely melting the amorphous silicon. Then, there is no solid phase seed in the melted regions for starting crystallization growth.

As shown in FIG. 11, the amorphous silicon layer exposed to the laser beam includes solid phase regions 1a and liquid phase regions 1b. The grain growth starts from the boundary 53 of the solid phase regions 1a and the liquid phase regions 1b and proceeds in a direction perpendicular to the boundary 53. Referring to FIG. 11, the grain growth starts from the upper boundary 58a and the lower boundary 58b, proceeds downward and upward, respectively, and stops at a central transverse line 53 where the laterally growing grains 58 meet each other.

Referring to FIGS. 10A and 10B, the crystallization is performed by using the stepwise slits 51a and then by the rectangular slits 51b. Since the stepwise slits 51a and the rectangular slits 51b are offset, all areas of the amorphous silicon layer are crystallized. The grain growth is dominant at the positions overlapping the stepwise slits 51a and the rectangular slits 51b of the mask.

In the meantime, a current driving capacity of a TFT depends on the length and the width of the polycrystalline grains 58, which are determined by those of the slits 51 in the mask used for SLS. In particular, the length and the width of the polycrystalline grains 58 are controlled by adjusting the overlapping distance between the stepwise slits 51a and the rectangular slits 51b shown in FIGS. 10A and 10B. FIG. 10B shows the overlapping distances a, b, c and d.

For example, when the stepwise boundary 57 is a lower boundary, the grain growth points at the upper portions are different. Accordingly, the sizes of the grains are controllable, and the grain boundary between an upper grain and a lower grain is also controllable.

FIG. 11 shows the grains with different sizes and the grain boundaries which do not coincide with each other.

In this way, a plurality of driving TFTs having different current driving capacities are obtained by a SLS process.

In this case, the width L of the steps with different overlapping lengths a, b, c and d is preferably equal to the width of a pixel area for uniformly distributing the TFTs with different current driving capacities.

Accordingly, the variations of the characteristics of the TFT are not easily conceived and the image quality of the display is improved.

Figure 12:
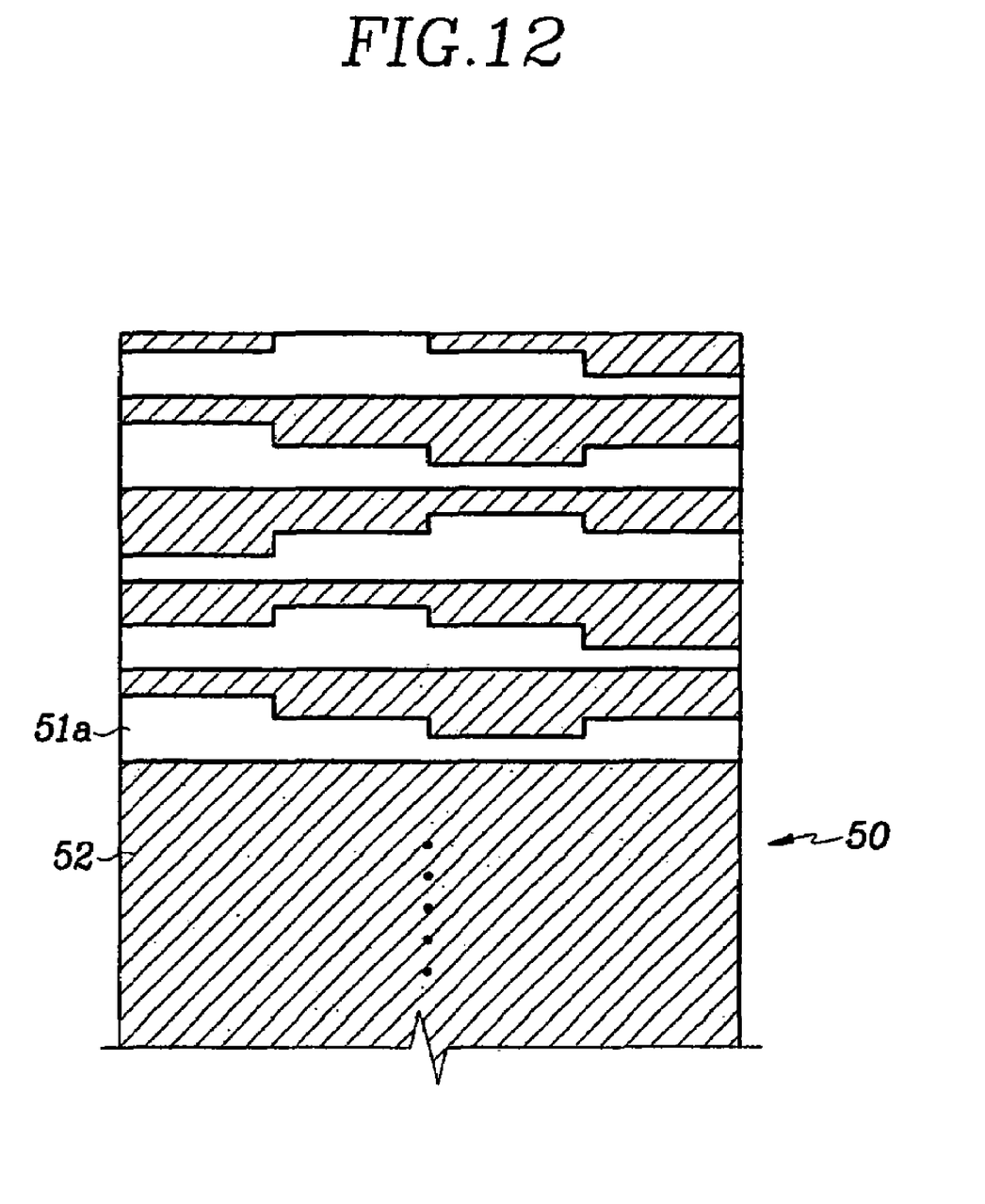
FIG. 12 illustrates a mask according to another embodiment of the present invention.

FIG. 12 illustrates a mask according to another embodiment of the present invention.

Referring to FIG. 12, a mask according to this embodiment includes only stepwise slits 51a. Once a laser illumination step is performed, the mask is moved upward or downward by a predetermined distance for a next illumination step.

In the above-described structure, although the TFTs have different characteristics, the TFTs are uniformly distributed over the substrate such that the difference is not easily conceived.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method of manufacturing a thin film transistor array panel, the method comprising:
   depositing an amorphous silicon layer on an insulating substrate;
   converting the amorphous silicon layer to a polysilicon layer by a plurality of laser shots using a mask;
   forming a gate insulating layer on the polysilicon layer;
   forming a plurality of gate lines on the gate insulating layer;
   forming a first interlayer insulating layer on the gate lines;
   forming a plurality of data lines on the first interlayer insulating layer;
   forming a second interlayer insulating layer on the data lines; and
   forming a plurality of pixel electrodes on the second interlayer insulating layer, wherein the mask comprises a plurality of transmitting areas and a plurality of blocking areas arranged in a mixed manner and forming blocks, and characteristics of polysilicon areas of said polysilicon layer adjacent in the transverse and longitudinal directions are different, wherein the transmitting areas and the blocking areas in different blocks are differently arranged, and the step of converting comprises:

sequentially illuminating a laser beam through the mask at different positions of the mask so as to completely illuminate the amorphous silicon layer with the laser beam.

2. The method of claim 1, further comprising:

forming a plurality of partitions on the pixel electrodes for receiving a plurality of organic light emitting members, respectively, in areas defined by the partitions; and forming a common electrode for use by the light emitting members.

3. The method of claim 1, wherein the transmitting areas and the blocking areas of the mask have areas and shapes determined by at least one pixel area.

4. The method of claim 1, wherein the transmitting areas included in all of the blocks form a complete block.

* * * * *